(12) United States Patent
Lvovsky

(10) Patent No.: US 7,295,012 B1
(45) Date of Patent: Nov. 13, 2007

(54) METHODS AND APPARATUS FOR MRI SHIM ELEMENTS

(75) Inventor: Yuri Lvovsky, Florence, SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/414,606

(22) Filed: Apr. 28, 2006

(51) Int. Cl.
*G01V 3/00* (2006.01)
(52) U.S. Cl. ...................... 324/320; 324/322
(58) Field of Classification Search ........ 324/300–322; 335/299, 301
See application file for complete search history.

(56) References Cited

U.S. PATENT DOCUMENTS

| | | | | |
|---|---|---|---|---|
| 4,642,569 A | * | 2/1987 | Hayes et al. ............... | 324/318 |
| 4,680,551 A | | 7/1987 | O'Donnell et al. ......... | 324/320 |
| 5,003,276 A | | 3/1991 | Sarwinski et al. .......... | 335/304 |
| 5,047,720 A | | 9/1991 | Guy ............................ | 324/320 |
| 5,317,298 A | * | 5/1994 | Dorri et al. ................. | 335/301 |
| 5,349,297 A | | 9/1994 | DeMeester et al. ......... | 324/318 |
| 5,400,786 A | | 3/1995 | Allis ........................... | 128/653 |
| 5,414,399 A | * | 5/1995 | Breneman et al. .......... | 335/301 |
| 5,431,165 A | | 7/1995 | Sellers ........................ | 128/653 |
| 5,530,355 A | * | 6/1996 | Doty ........................... | 324/318 |
| 5,532,597 A | | 7/1996 | McGinley et al. .......... | 324/319 |
| 5,627,471 A | | 5/1997 | Kinanen ...................... | 324/319 |
| 5,635,839 A | | 6/1997 | Srivastava et al. .......... | 324/320 |
| 5,680,086 A | * | 10/1997 | Allis et al. .................. | 335/296 |
| 5,689,187 A | * | 11/1997 | Marek et al. ................ | 324/318 |
| 5,864,275 A | | 1/1999 | Ohashi et al. ............... | 335/306 |
| 5,923,235 A | | 7/1999 | Van Oort ..................... | 335/301 |
| 5,963,117 A | | 10/1999 | Ohashi et al. ............... | 335/306 |
| 5,999,076 A | | 12/1999 | Becker, Jr. et al. ......... | 335/301 |
| 6,002,255 A | | 12/1999 | Pulyer ......................... | 324/320 |
| 6,150,911 A | | 11/2000 | Katznelson et al. ........ | 335/299 |
| 6,218,839 B1 | | 4/2001 | Shaikh et al. ............... | 324/320 |
| 6,275,128 B1 | | 8/2001 | Aoki et al. .................. | 335/299 |
| 6,294,972 B1 | | 9/2001 | Jesmanowicz et al. ...... | 335/301 |
| 6,538,545 B2 | | 3/2003 | Wakuda et al. ............. | 335/296 |
| 6,566,991 B1 | | 5/2003 | Rimkunas et al. .......... | 335/301 |
| 6,777,939 B2 | * | 8/2004 | Bechtold et al. ............ | 324/322 |
| 7,167,004 B1 | * | 1/2007 | Kruip .......................... | 324/320 |
| 2003/0011456 A1 | | 1/2003 | Yoshida et al. ............. | 335/299 |

FOREIGN PATENT DOCUMENTS

| | | | |
|---|---|---|---|
| EP | 0460 762 A1 | * | 12/1991 |
| EP | 0677 751 A1 | * | 10/1995 |
| EP | 0 219 404 | * | 4/1997 |
| GB | 95104102.9 | | 10/1995 |

OTHER PUBLICATIONS

Grant et al: IEEE Transactions on Mechanics; vol. 37, No. 4, Jul. 2001.*

* cited by examiner

*Primary Examiner*—Brij B. Shrivastav
(74) *Attorney, Agent, or Firm*—Fisher Patent Group, LLC; Thomas M. Fisher

(57) ABSTRACT

A MRI shim element includes a plurality of thin wires extending substantially parallel to each other wherein each wire has cross sectional dimensions less than $\delta_{sk}$, wherein $\delta_{sk}$ is the wire's skin depth.

13 Claims, 3 Drawing Sheets

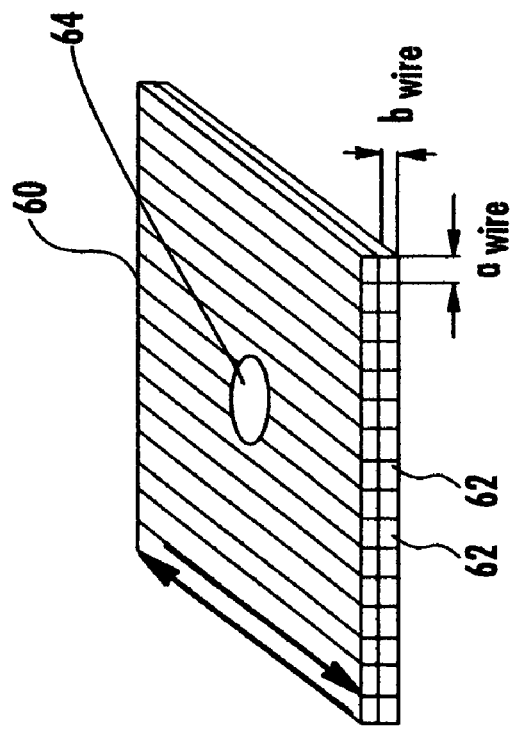
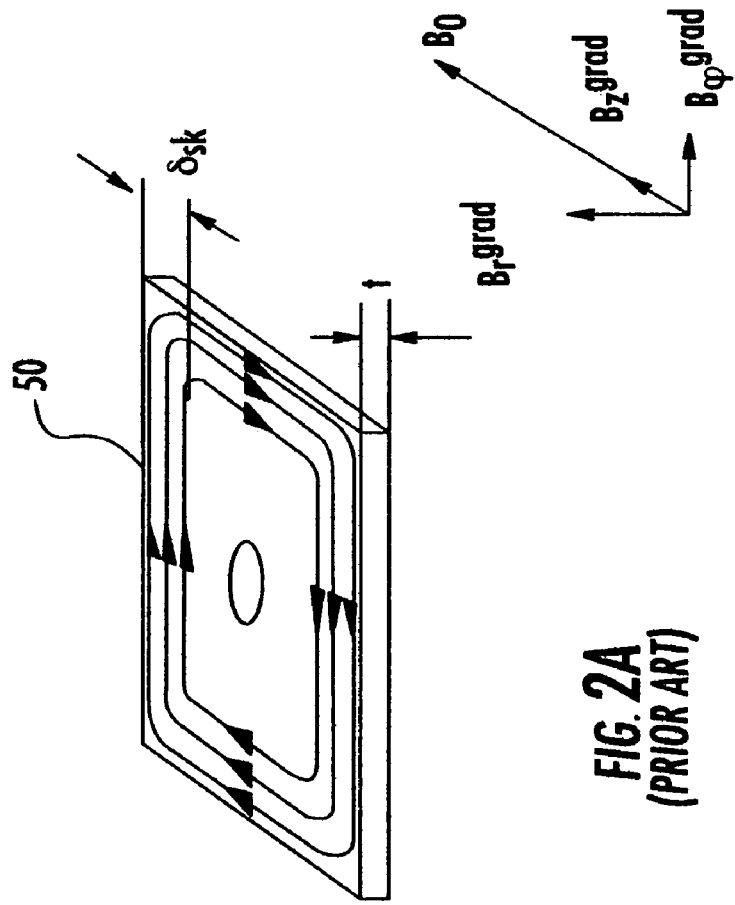
FIG. 2B
FIG. 2A
(PRIOR ART)

METHODS AND APPARATUS FOR MRI SHIM ELEMENTS

BACKGROUND OF THE INVENTION

This invention relates generally to methods and apparatus for magnetic resonance imaging (MRI) systems, and more particularly to methods and apparatus that facilitate making and using passive shim elements that provide for low eddy currents and an improved image stability.

Achieving a high final field homogeneity in MRI magnets typically requires the use of magnetic shimming, either a fully passive or a hybrid system that includes passive shims as an integral part. Shim elements made of magnetized steel, loaded strategically on shim rails, inserted inside the bore and saturated by the main field of the magnet, compensate for manufacturing tolerances and environmental inhomogeneities. These shim elements are exposed to pulsing fields from a plurality of gradient coils which generate heat in the shim elements, raising their temperature and thus affecting magnetic field stability (both B0 and homogeneity) due to the temperature-dependent saturation $B_S(T)$ of the shims. Among major contributors to the shim heating are eddy currents induced in the conducting shims by the changing magnetic flux from the gradient coils. There is a need for efficient inexpensive passive shim elements with low eddy current heat generation.

BRIEF DESCRIPTION OF THE INVENTION

In one aspect, a MRI shim element includes a plurality of thin wires extending substantially parallel to each other wherein each wire has cross sectional dimensions less than $\delta_{sk}$, wherein $\delta_{sk}$ is the wire's skin depth.

In another aspect, a method for making a plurality of shim elements is provided. The method includes placing a plurality of thin wires extending substantially parallel to each other to form either a flat sheet or an arced structure wherein each wire has cross sectional dimensions less than $\delta_{sk}$, wherein $\delta_{sk}$ is the wire's skin depth, and cutting or punching the flat sheet or arced structure to form a plurality of shim elements.

In still another aspect, an imaging apparatus for producing Magnetic Resonance (MR) images of a subject is provided. The apparatus has a magnet assembly for producing a static magnetic field B0 and a gradient coil assembly disposed within the magnet assembly for generating a magnetic field gradient for use in producing MR images, the apparatus includes a MRI shim element including a plurality of thin wires extending substantially parallel to B0.

In still another aspect, an imaging apparatus for producing Magnetic Resonance (MR) images of a subject is provided. The apparatus has a magnet assembly for producing a static magnetic field B0 and a gradient coil assembly disposed within the magnet assembly for generating a magnetic field gradient for use in producing MR images, the apparatus includes a MRI shim element including a plurality of thin wires extending substantially perpendicular to B0

DESCRIPTION OF THE DRAWINGS

FIG. 2 illustrates two shim elements.

DETAILED DESCRIPTION OF THE INVENTION

Herein described are methods and apparatus that provide a simple design to control the eddy currents generated in the shim elements during any gradient operational conditions.

As used herein, an element or step recited in the singular and proceeded with the word "a" or "an" should be understood as not excluding plural said elements or steps, unless such exclusion is explicitly recited. Furthermore, references to "one embodiment" of the present invention are not intended to be interpreted as excluding the existence of additional embodiments that also incorporate the recited features.

Figure 1:
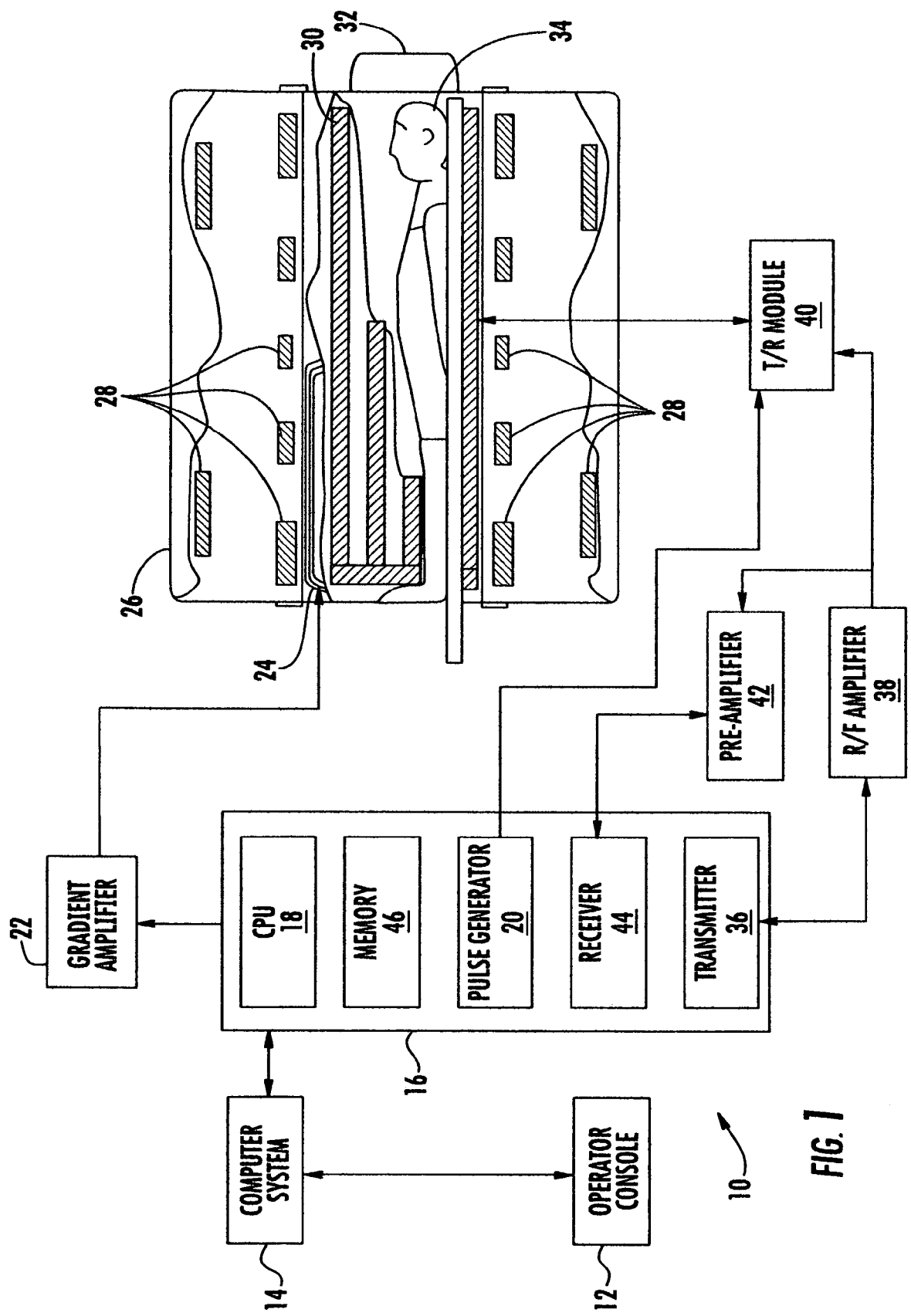
FIG. 1 illustrates a magnetic resonance imaging (MRI) system.

FIG. 1 illustrates a simplified block diagram of a system 10 for producing images to which embodiments of the below described shim elements of the present invention are applicable. Although a bore-type magnet is illustrated in FIG. 1, the present invention is equally applicable to open magnet systems and other known types of MRI scanners. The MRI system could be, for example, a GE Signa MR scanner available from GE Healthcare which is adapted as described herein, although other systems could be used as well.

The operation of the MR system 10 is controlled from an operator console 12, which includes a keyboard and control panel and a display (not shown). The console 12 communicates with a separate computer system 14 that enables an operator to control the production and display of images. The computer system 14 includes a number of modules, which communicate with each other through a backplane. These include an image processor module, a CPU module, and a memory module, known in the art as a frame buffer for storing image data arrays. The computer system 14 is linked to a disk storage or optical drive for storage of image data and programs, and it communicates with a separate system control 16 through a high speed serial link.

The system control 16 includes a set of modules connected together by a backplane. These include a CPU module 18 and a pulse generator module 20, which connects to the operator console 12 through a serial link. The system control 16 receives commands from the operator, which indicate the scan sequence that is to be performed. The pulse generator module 20 operates the system components to carry out the desired scan sequence. It produces data that indicate the timing, strength, and shape of the radio frequency (RF) pulses which are to be produced, and the timing of and length of the data acquisition window. The pulse generator module 20 connects to a set of gradient amplifiers 22 comprising of $G_x$, $G_y$, and $G_z$ amplifiers (not shown) to indicate the timing and shape of the gradient pulses to be produced during the scan.

The gradient waveforms produced by the pulse generator module 20 are applied to the gradient amplifier system 22. Each gradient amplifier excites a corresponding gradient coil in an assembly generally designated as 24 to produce the magnetic field gradients used for position encoding acquired signals. The gradient coil assembly forms part of a magnet assembly 26 which includes a polarizing magnet 28 and a whole-body RF coil 30. A volume 32 is shown as the area within magnet assembly 26 for receiving a subject 34 and includes a patient bore. As used herein, the usable volume of a MRI scanner is defined generally as the volume within volume 32 that is a contiguous area inside the patient bore where the homogeneity of the main, the gradient and the RF fields are within known, acceptable ranges for imaging.

A transmitter module 36 in the system control 16 produces pulses that are amplified by an RF amplifier 38 coupled to RF coil 30 by a transmit/receive module 40. The resulting signals radiated by the excited nuclei in the subject 34 may be sensed by the same RF coil 30 and coupled through the transmit/receive module 40 to a preamplifier 42. The amplified MR signals are demodulated, filtered, and digitized in a receiver 44. The transmit/receive switch 40, is controlled by a signal from the pulse generator module 20 to electrically couple the transmitter 36 to the RF coil during the transmit mode and to connect the preamplifier 42 to the RF coil during the receive mode.

The MR signals picked up by RF coil 30 are digitized by the receiver module 44 and transferred to a memory module 46 in the system control 16. When the scan is completed, an entire array of data has been acquired in the memory module 16. An array processor (not shown) operates to Fourier transform the data into an array of image data. These image data are conveyed to the computer system 14 where they are stored. In response to commands received from the operator console 12, these image data may be further processed by an image processor within computer system 14 and conveyed to the operator console 12 and subsequently displayed.

All commercial MRI systems employ passive shims to attain the desired final homogeneity of the uniform magnet field B0. A typical passive shim system includes a set of magnetized elements of predetermined different volumes/denominations, which allows one to create a desired magnetized moment on each shimming position. The degree of quantization in such a system is determined by the number of shim denominations and the volume of the smallest shim element. Passive shims are positioned inside the bore or within the gradient assembly, e.g. on the shim rails, in such a way that the multitude of available shimming positions would provide an adequate coverage of both axial and circumferential range, in order to enable compensation of both axial and radial harmonics representing B0 inhomogeneity. In European patent application EP 0677751, the shim system employs shimming rings. Such rings due to their symmetry can be used to compensate axial harmonics only, while the need to compensate radial harmonics still remains. This need can be addressed by a separate set of discrete shim elements which unlike rings, do not have axisymmetric geometry and thus can allow variation of their circumferential distribution. The shim elements described below can be positioned on rails extending axially as well as circumferentially, and therefore provide full complete compensation for both axial and radial harmonics without resorting to additional rings, thus reducing complexity. In the radial direction, a stack-up of shim elements of different denominations within maximum allowable radial thickness, provides the desired total mass on each given position. System 10, in some embodiments, includes shim elements as described below.

Herein described are shim elements that are composite and made of a parallel alignment of multiple long ferromagnetic steel wires held together by a filling material. The filling material can be epoxy, rubber, plastic, etc. When the shim elements are positioned on the rail, the wire orientation is typically parallel to the B0 field of the magnet. However, the shim elements may be turned such that the wires extend perpendicular to B0 and have a reduced magnetization. Additionally, the shim elements can be at any angle between being parallel and perpendicular to B0 in order to achieve various shimming effects. Different sized shim elements would be employed to provide the desired quantization.

FIG. 2 illustrates two different shim element designs; a prior art shim 50 and a new shim element 60. The main magnet field B0 and gradient magnet field components are also shown in FIG. 2. By reducing wire cross-sectional dimensions a, and b to be below the skin depth $\delta_{sk}$, one can reduce eddy currents caused by either $dB_r^{grad}/dt$, $dB_j^{grad}/dt$, or $dB_z^{grad}/dt$ to any predetermined level. This is illustrated in FIG. 2 portions a) and b). The skin depth of the shim material equals to $\delta_{sk}=\sqrt{2\rho/\mu\mu_0\omega}$, where $\rho$ is the material resistivity, $\mu$ is the material relative permeability, $\mu_0$ is the permeability of vacuum, and $\omega$ is the gradient circular or angular frequency. In a saturated state inside the magnet, $\mu$ is close to one. With 1006 steel, for example, $\delta_{sk}$=6.6 mm at 1 kHz gradient frequency and is 21 mm at 100 Hz. In the conventional shim piece 50 where dimensions are much greater than ask, (as in 2a) eddy currents are flowing around the outer perimeter. In the herein provided configuration, rectangular or round wires 62 have dimensions less than $\delta_{sk}$, and very limited or no contact with each other. In some embodiments, the dimensions are much less than $\delta_{sk}$. For example, some embodiments use dimensions of ¼ $\delta_{sk}$ and ⅓ $\delta_{sk}$. The eddy currents flow as indicated by an arrow in FIG. 2b. The resultant heat generation in each wire is proportional to $d^3$ where d is the dimension normal to the magnetic flux from the gradients. Since the number of wires per piece (in each direction) increases as 1/d with smaller d, the total heat generation per piece is decreasing with wire diameter as proportional to $d^2$. A central opening 64 in the shim elements allow for easy mounting on a stud or screw. However, the central opening is not necessary, and the shim elements may be mounted in other ways. For example, the rail may include a pocket sized to receive a shim element.

Figure 3:
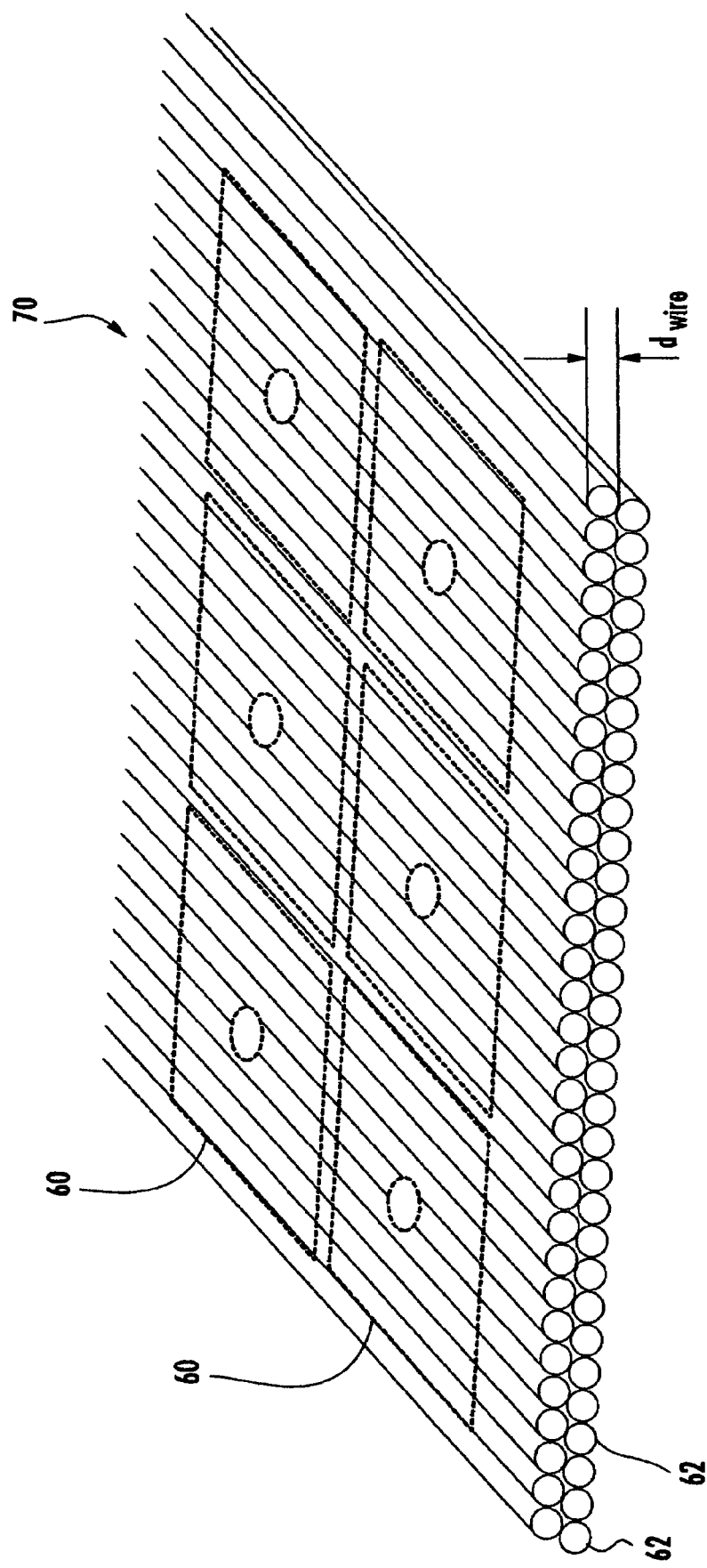
FIG. 3 illustrates that shim elements of different sizes can be cut out or punched out from a prefabricated composite wire/epoxy sheet.

FIG. 3 illustrates that shim elements 60 of different sizes can be cut out or punched out from a prefabricated composite wire/epoxy sheet 70. In one example, the wires 62, either round or rectangular, are laid out and impregnated with a non-conductive bonding agent or filler material, such as, for example, epoxy. Additionally, in another embodiment, rather than constructing a flat sheet, the wires are wound around a drum or other jig and then the non-conductive bonding agent is applied. The arced structure from the winding around the drum may be flattened (bent straight) or left in an arc resulting in an arced shim element. In the embodiment with round wire, one advantage and technical effect is lower cost. The wires are either bare (limited linear contact), or pre-coated with varnish (no contact) and than impregnated by epoxy. The maximum attainable volumetric ratio (bare wire) is $\pi/2\cdot\sqrt{3}$, or 90.7%.

In the embodiment with rectangular wire, one advantage and technical effect is higher volumetric magnetization (filling factor). Wires can be separated (either sleeved or interlaid e.g. by glass cloth or other non conductive material) prior to the impregnation. Additionally, multiple shim elements may be stacked in multiple layers either aligned as shown in FIG. 2b, or offset as shown in FIG. 3.

Exemplary embodiments are described above in detail. The assemblies and methods are not limited to the specific embodiments described herein, but rather, components of each assembly and/or method may be utilized independently and separately from other components described herein.

While the invention has been described in terms of various specific embodiments, those skilled in the art will recognize that the invention can be practiced with modification within the spirit and scope of the claims.

What is claimed is:

1. Apparatus comprising:
   a) a MRI shim element comprising:
   b) a plurality of thin wires extending substantially parallel to each other wherein each wire has cross sectional dimensions less than dsk,
   c) wherein dsk is the wire's skin depth with a gradient frequency spectrum of up to about 1 kHz.

2. A MRI shim element in accordance with claim 1 wherein said wires are stacked in multiple layers.

3. A MRI shim element in accordance with claim 2 wherein said wires are round and coated with a varnish.

4. A MRI shim element in accordance with claim 2 wherein said wires are impregnated in non-conductive bonding agent.

5. A MRI shim element in accordance with claim 2 wherein said wires are rectangular and separated from each other by an insulating material.

6. A MRI shim element in accordance with claim 5 wherein said insulating material comprises a glass cloth.

7. A MRI shim element in accordance with claim 6 wherein said wires are impregnated in an epoxy.

8. An imaging apparatus for producing Magnetic Resonance (MR) images of a subject having a magnet assembly for producing a static magnetic field B0 and a gradient coil assembly disposed within said magnet assembly for generating a magnetic field gradient for use in producing MR images, said apparatus comprising a MRI shim element comprising a plurality of thin wires extending substantially parallel to B0.

9. An imaging apparatus in accordance with claim 8 wherein said wires are round and coated with a varnish.

10. An imaging apparatus in accordance with claim 9 wherein said wires are fabricated from a low carbon steel and have a diameter of less than about 3 mm.

11. An imaging apparatus in accordance with claim 8 wherein said wires are rectangular with all cross sectional dimensions less than about 3 mm.

12. An imaging apparatus in accordance with claim 11 wherein said wires are rectangular and separated from each other by an insulating material.

13. An imaging apparatus for producing Magnetic Resonance (MR) images of a subject having a magnet assembly for producing a static magnetic field B0 and a gradient coil assembly disposed within said magnet assembly for generating a magnetic field gradient for use in producing MR images, said apparatus comprising a MRI shim element comprising a plurality of thin wires extending substantially perpendicular to B0.

* * * * *